United States Patent [19]

Harada et al.

[11] Patent Number: 5,700,127
[45] Date of Patent: Dec. 23, 1997

[54] SUBSTRATE PROCESSING METHOD AND SUBSTRATE PROCESSING APPARATUS

[75] Inventors: Junji Harada; Ichiro Harada; Koji Nakamura, all of Kumamoto, Japan

[73] Assignee: Tokyo Electron Limited, Tokyo, Japan

[21] Appl. No.: 667,712

[22] Filed: Jun. 21, 1996

[30] Foreign Application Priority Data

Jun. 27, 1995 [JP] Japan ................... 7-183539
Jun. 27, 1995 [JP] Japan ................... 7-183540

[51] Int. Cl.$^6$ ................................ H01L 21/68
[52] U.S. Cl. ............... 414/416; 414/222; 414/786; 414/937; 414/217; 414/939; 414/940; 118/719
[58] Field of Search ............... 414/786, 403, 414/404, 416, 417, 217, 222, 935, 936, 937, 938, 939, 940, 941; 118/500, 719; 364/478

[56] References Cited

U.S. PATENT DOCUMENTS

| | | | |
|---|---|---|---|
| 3,851,972 | 12/1974 | Smith et al. | 414/937 X |
| 4,954,721 | 9/1990 | Suzuki | 414/940 X |
| 5,024,570 | 6/1991 | Kiriseko et al. | 414/937 X |
| 5,131,799 | 7/1992 | Nishi et al. | 414/938 X |
| 5,319,216 | 6/1994 | Mokjo et al. | 414/938 X |

FOREIGN PATENT DOCUMENTS

| | | | |
|---|---|---|---|
| 145831 | 6/1987 | Japan | 414/937 |
| 149152 | 7/1987 | Japan | 414/941 |
| 56338 | 2/1992 | Japan | 414/937 |
| 41442 | 2/1993 | Japan | 414/937 |
| 82632 | 4/1993 | Japan | 414/935 |
| 87511 | 3/1994 | Japan | 414/937 |

*Primary Examiner*—Frank E. Werner
*Attorney, Agent, or Firm*—Oblon, Spivak, McClelland, Maier & Neustadt, P.C.

[57] ABSTRACT

According to the present invention, a substrate processing method has (a) the step of predetermining initial conditions for cassettes and substrates before processing is started, (b) the step of setting the cassettes in which the substrates are stored, in the loading/unloading section on the basis of the initial conditions, (c) the step of detecting the states of the cassettes set in the loading/unloading section and checking, on the basis of the detection results, whether the cassettes are set in the states set in the step (a), (d) the step of displaying the states of the cassettes when it is determined in the step (c) that the state of at least one cassette is not the state set in the step (a), (e) the step of resetting the cassette in the state set in the step (a) on the basis of the display in the step (d), (f) the step of detecting the substrates which are present in the cassettes set in the loading/unloading section and obtaining mapping data on the basis of the detection results, (g) the step of selecting a substrate from the cassettes in the loading/unloading section on the basis of the mapping data and the initial conditions, (h) the step of extracting the selected substrate from the cassettes, conveying the substrate to a processing section, and processing the substrate according to the initial conditions, and (i) the step of storing the processed substrate in a cassette set in the loading/unloading section.

21 Claims, 10 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a substrate such as a semiconductor wafer or an LCD glass substrate.

2. Description of the Related Art

In manufacturing a semiconductor device, the following processing system is used. That is, a photoresist is coated on the surface of a substrate, a circuit pattern is formed in the resist layer by a photolithography technique, and the resist layer is developed. For example, in a resist coating/developing process system for a semiconductor wafer, wafers to be processed is selected from a supply cassette of a loading/unloading section, the wafers are sequentially conveyed to a processing section, and the processed wafers are stored in a recovery cassette of the loading/unloading section. In the resist coating/developing process system for an LCD substrate, a cassette is stably fixed and held on a placing table of a loading/unloading section, substrates to be processed is selected from a supply cassette, and the substrates are sequentially conveyed to a processing section. The processed substrates are stored in a recovery cassette.

However, when the cassette is not set at an accurate position with respect to the placing table of the loading/unloading section, or when the cassette is moved during processing, or when the position of the cassette is shifted because the cassette is unstably set, a substrate transferring device may be defective, and processing cannot be continued. Because the position information of the cassette is not accurate, a substrate may collide with the substrate transferring device or other members, and the WP may be damaged. Since these accidents occur, processing efficiency and a yield are not stable in a conventional apparatus.

In order to form a high-integration circuit pattern in a thin film layer on a wafer surface, the following etching process system is used. That is, a reaction gas is converted into a plasma at a high degree of vacuum, and the thin film layer is dry-etched by active seeds in the plasma. In this etching process system, wafers are extracted from a supply cassette of a loading/unloading section by a substrate transferring device, the wafers are sequentially etched in a processing section and then subjected to ashing and light etching. The resultant wafers are stored in a recovery cassette of the loading/unloading section.

When the substrate transferring device or processing device is suddenly stopped during processing because of any trouble, in order to restart the processing or to know the trouble, a substrate in conveying or processing must be recovered from the processing section to the loading/unloading section. In a conventional method, after the apparatus is reset, substrates are recovered in order of unit numbers, i.e., in order of processing steps.

However, in the conventional method, since the processing step of each substrate which is performed at present cannot be known, substrates which can be recycled cannot be distinguished from substrates which cannot be recycled. For this reason, the substrates which can be recycled are wasted together with the substrates which cannot be recycled, and the production yield decreases.

SUMMARY OF THE INVENTION

It is an object of the present invention to provide a substrate processing method and apparatus capable of increasing the processing efficiency and production yield of substrates.

It is another object of the present invention to provide a substrate processing method and apparatus in which a substrate (incomplete processed substrate) in processing can be recycled even if processing is intermediated due to any trouble.

According to the present invention, there is provided a substrate processing method characterized by comprising: (a) the step of predetermining initial conditions for cassettes and substrates before processing is started; (b) the step of setting the cassettes in which the substrates are stored, in a loading/unloading section on the basis of the initial conditions; (c) the step of detecting the states of the cassettes set in the loading/unloading section and checking, on the basis of the detection results, whether the cassettes are set in the states set in the step (a); (d) the step of displaying the states of the cassettes when it is determined in the step (c) that the state of at least one cassette is not the state set in the step (a); (e) the step of resetting the cassette in the state set in the step (a) on the basis of the display in the step (d); (f) the step of detecting the substrates which are present in the cassettes set in the loading/unloading section and obtaining mapping data on the basis of the detection results; (g) the step of selecting a substrate from the cassettes in the loading/unloading section on the basis of the mapping data and the initial conditions; (h) the step of extracting the selected substrate from the cassettes, conveying the substrate to a processing section, and processing the substrate according to the initial conditions; and (i) the step of storing the processed substrate in a cassette set in the loading/unloading section.

According to the present invention, there is provided a substrate processing method characterized by comprising: (A) the step of predetermining initial conditions of a supply cassette, a recovery cassette, and substrates; (B) the step of setting the supply cassette and the recovery cassette in a loading/unloading section on the basis of the initial conditions; (C) the step of detecting the substrate which are present in the cassette set in the loading/unloading section and obtaining mapping data on the basis of the detection results; (D) the step of selecting a substrate from the supply cassette on the basis of the mapping data and the initial conditions; (E) the step of extracting the selected substrate from the supply cassette, conveying the substrate to a processing section, and processing the substrate according to the initial conditions; (F) the step of detecting the states of a substrate in processing, a processed substrate, and a substrate in conveyance to display the states when an operation of the processing section is stopped to interrupt processing for the substrates; (G) the step of determining specific cassettes in which the substrate in processing, the processed substrate, and the substrate in conveyance on the basis of the display in the step (F), the mapping data, and the initial conditions; and (H) the step of storing the substrate in processing, the processed substrate, and the substrate in conveyance in the recovery cassette or the supply cassette according to the determination in the step (G).

According to the present invention, there is provided a substrate processing apparatus comprising: means for predetermining initial conditions of cassettes and substrates before processing is started; a loading/unloading section having a placing table on which the cassettes are placed; a processing section having a plurality of processing units for processing the substrates; means for setting the cassettes in the loading/unloading section on the basis of the initial conditions; a substrate transferring device for extracting substrates from the cassettes set in the loading/unloading section and conveying the substrates to the processing section; a first sensor for detecting the substrates which are present in the cassettes set in the loading/unloading section; means for forming mapping data of the substrates in the cassettes on the basis of the detection results from the first sensor and storing the mapping data; control means for calling the mapping data from the data storing means and controlling the substrate transferring device on the basis of the mapping data and the initial conditions; a second sensor for detecting the states of the cassettes set in the loading/unloading section; and display means for displaying the states of the cassettes detected by the second sensor, characterized in that the control means causes the setting means to reset the cassettes on the placing table according to the initial states when the states of the cassettes detected by the second sensor do not satisfy the initial conditions.

In this case, the "initial states of cassettes and substrates" means processing plan information which is filed in the database of a host computer before processing is started. For example, in the plan information, a cassette having an identification number of 7 is set on the placing table of the second port of the loading/unloading section, substrates having identification numbers of A1001 to A1025 are stored in the seventh cassette, and the substrate of A1001 is processed first. When the initial conditions (processing plan information) is compared and collated with the mapping data, the difference between the plan and the execution can be reliably prevented.

When the processing section is suddenly stopped in processing a substrate, the state of the substrate (incomplete substrate) whose processing is interrupted is detected by a sensor in the processing section. For this reason, it is accurately determined on the basis of the detection information whether the incomplete substrate is stored in a recovery cassette or a supply cassette. Therefore, the number of substrates which are wasted is decreased, and a production yield increases.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Various preferred embodiments of the present invention will be described below with reference to the accompanying drawings.

The first embodiment of the present invention will be described below with reference to FIGS. 1 to 4. In the first embodiment, the present invention is used in a resist processing system for coating a resist on a semiconductor wafer W to develop the resist.

Figure 1:
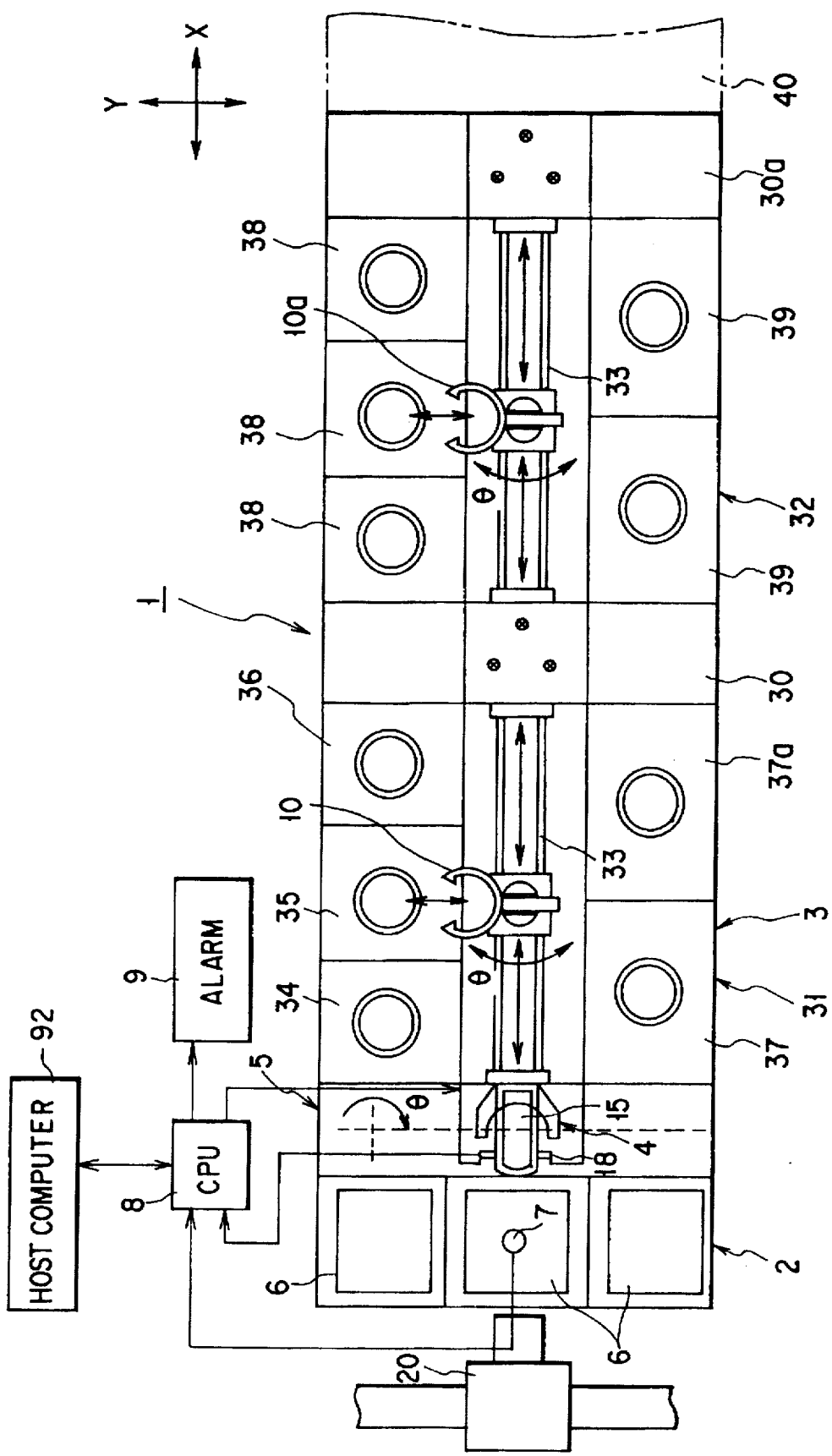
FIG. 1 is a schematic plan view showing a substrate processing apparatus (resist processing system for a semiconductor wafer) according to an embodiment of the present invention.

As shown in FIG. 1, a resist processing system 1 for a semiconductor wafer comprises a loading/unloading section 2, a processing section 3, a substrate transferring device 4 using a transfer arm scheme, an exchanging section 5, and two main arms 10 and 10a. The loading/unloading section 2 comprises a placing table, arranged on one end side of the resist processing system 1, on which a plurality of wafer cassettes 6 are placed.

Figure 2:
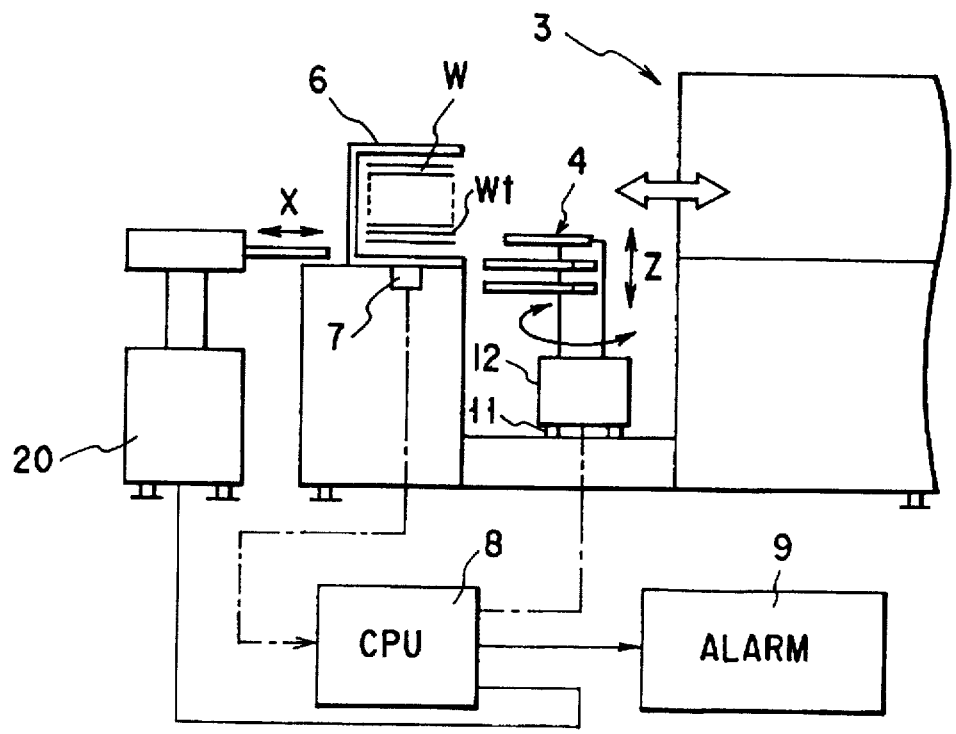
FIG. 2 is a schematic side view showing a part of the substrate processing apparatus along a convey path.

As shown in FIG. 2, a cassette convey device 20 is arranged on the front side of the loading/unloading section 2, so that the wafer cassettes 6 are loaded in or unloaded from the loading/unloading section 2 by the cassette convey device 20. In each cassette 6, e.g., 25 semiconductor wafers W are stored. The cassette 6 is placed on the placing table of the loading/unloading section 2 such that the wafer W are kept horizontal. The exchanging section 5 is arranged between the loading/unloading section 2 and the processing section 3. The exchanging section 5 comprises the substrate transferring device 4, and the wafers W are extracted from the wafer cassette 6 by the substrate transferring device 4 one by one.

The processing section 3 comprises a first processing section 31, a second processing section 32, and an exposure processing section 40. The first processing section 31 has a plurality of processing units 34 to 37a, a common convey path 33, and the substrate transferring device (main arm) 10. The processing units 34 to 37a are arranged on both the sides of the common convey path 33, and have loading/unloading ports facing the common convey path 33. The main arm 10 is arranged such that the main arm 10 can travel along the common convey path 33, and the wafer W can be exchanged between the transfer arm 4 and each of the processing units 34 to 37a. The second processing section 32 also has a plurality of processing units 38 and 39, the common convey path 33, and the main arm 10a.

The processing unit 34 comprises a brush washing device for brush-washing the wafer W. A processing unit 35 comprises a jet-water washing device for washing the wafer W with high-pressure jet water. The processing unit 36 comprises an adhesion processing device for performing a hydrophobic process to the surface of the wafer W. The processing unit 37 comprises a resist coating device for coating a resist on the wafer W. The processing unit 37a comprises a resist removing device for removing the coated resist from the wafer W. The processing unit 38 comprises a baking device for heating the wafer W and a cooling device for cooling the wafer W. The processing unit 39 comprises a developing device for developing the coated resist.

A first interface section 30 is arranged between the first processing section 31 and the second processing section 32, and the wafer W is exchanged between the first processing section 31 and the second processing section 32 through the first interface section 30. A second interface section 30a is arranged between the second processing section 32 and the exposure processing section 40, and the wafer W is exchanged between the second processing section 32 and the exposure processing section 40 through the second interface section 30a.

A cassette sensor 7 is arranged at a proper position of the loading/unloading section 2 to detect whether the cassette 6 is on the placing table. As the cassette sensor 7, for example, a photosensor having a light-emitting element and a light-receiving element, a capacitance type sensor, a microswitch or the like can be employed. The cassette sensor 7 is connected to the input terminal of a central processing unit (CPU) 8. When the CPU 8 receives a cassette detection signal, the CPU 8 executes calculation with communicating with a host computer 92, and transmits command signals to the substrate transferring device 4, an alarm system 9, the main arms 10 and 10a, and the processing units 38 and 39, respectively. The alarm system 9 comprises an alarm unit such as a buzzer or an alarm unit, a display caused by a lighting type lamp, a screen display caused by a monitor, or the like.

Figure 3:
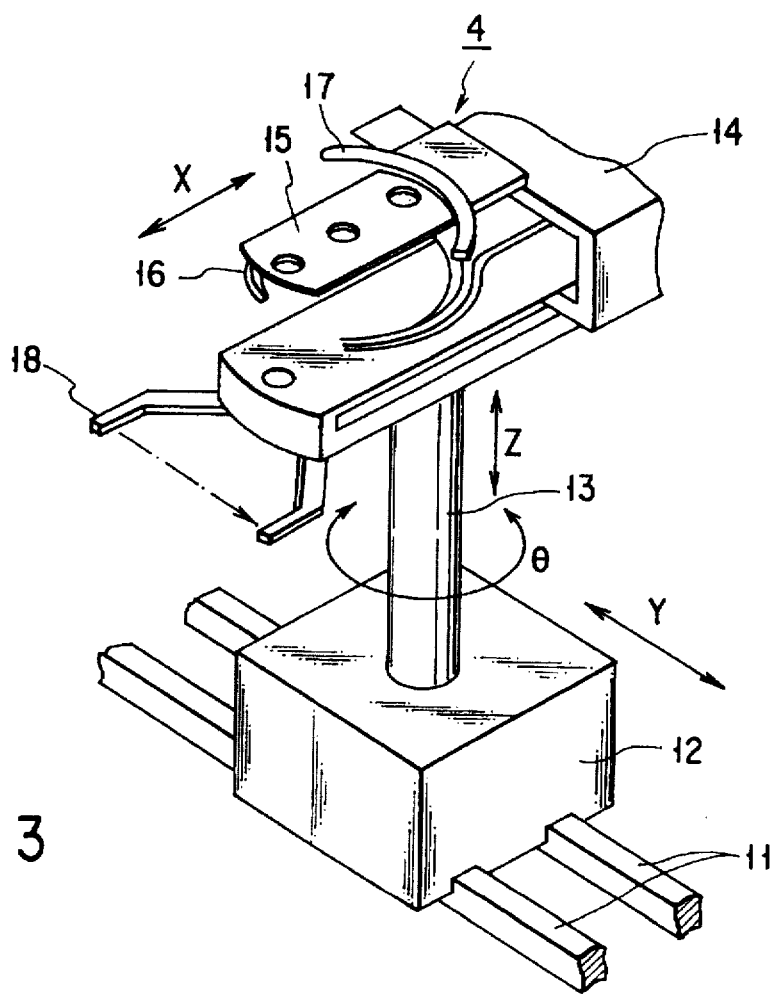
FIG. 3 is a perspective view showing a conveyor (transfer arm) for a semiconductor wafer.

As shown in FIG. 3, an upper drive section 14 of the substrate transferring device 4 is connected to a lower drive section 12 through a vertical shaft 13. The lower drive section 12 incorporates a Y-axis moving mechanism having a ball-screw mechanism, and the lower drive section 12 can be slidably moved along a rail 11 in the Y-axis direction. The lower drive section 12 incorporates a lifting mechanism and a θ-rotation mechanism having a stepping motor or the like, and the lower drive section 12 can vertically move the upper drive section 14 in a Z-axis direction, and can rotate the upper drive section 14 by an angle Θ about the Z axis. In addition, the upper drive section 14 incorporates an X-axis moving mechanism having a stepping motor or the like, and the upper drive section 14 can respectively move a transfer arm 15 and a holding arm 16 forward/backward in the X-Y plane.

The transfer arm 15 is constituted by a rectangular plate member having a width set to be inserted in the wafer cassette 6. A hole (not shown) communicating with a vacuum pump is formed in the upper surface of the transfer arm 15, so that the wafer W is held in vacuum adsorption. On the other hand, the holding arm 16 is constituted by a ring like member having a leading end which is notched. A plurality of support pins (not shown) project toward the inside of the holding arm 16, and the wafer W is supported by the support pins. A sensor 17 is arranged on the base portion of the transfer arm 15. The sensor 17 has, e.g., photoelectric detection element, and is used to confirm positional alignment of the wafer W to each processing device.

A mapping sensor 18 is attached to the tip portion of the upper drive section 14 to detect the presence/absence of the wafer W and the type of the wafer W in the cassette 6. In order to detect the type of the wafer W, it is checked whether the size of the wafer w is 6 inches or 8 inches, and whether the wafer W is unprocessed or processed. As the mapping sensor 18, a photosensor having a light-emitting section 18a and a light-receiving section 18b is employed. Note that the mapping sensor 18 comprises a function of detecting an erroneous operation of the mapping sensor 18 itself.

A timer function which can detect the operation state of the cassette sensor 7 may be added to the cassette sensor 7. By adding such a function, when the cassette sensor 7 continuously detects the wafer cassettes 6 after timer set time, the alarm system 9 can be operated to notify an operator that the cassette sensor 7 performs an erroneous operation. For example, when a convey robot (AGV) automatically places or loads the cassette 6, a completion signal representing completion of exchanging is transmitted. Thereafter, when the cassette sensor 7 performs an erroneous operation in which the presence/absence of cassette is continuously detected for a predetermined period of time, the cassette sensor 7 can be monitored. In addition, the cassette convey device 20 corrects the set position of the cassette 6 on the basis of a detection signal representing the absence of cassette. When the cassette 6 is reset, the substrate transferring device 4 detects the presence/absence of the wafer W in the wafer cassette 6 and detects (maps) the position of the wafer W.

When the mapping sensor 18 detects information different from information which is programmed in advance or detects the presence of a wafer W of a different type, the alarm system 9 is operated to notify an operator that abnormality occurs. The transfer arm 15 is moved backward from the wafer cassette 6 on the basis of the detection signal to return the substrate transferring device 4 to a home position. The cassette convey device 20 corrects the set position of the wafer cassette 6 on the basis of the detection signal. When the cassette 6 is reset, the substrate transferring device 4 detects the presence/absence of the wafer W in the wafer cassette 6 and detects the position of the wafer W.

Figure 4:
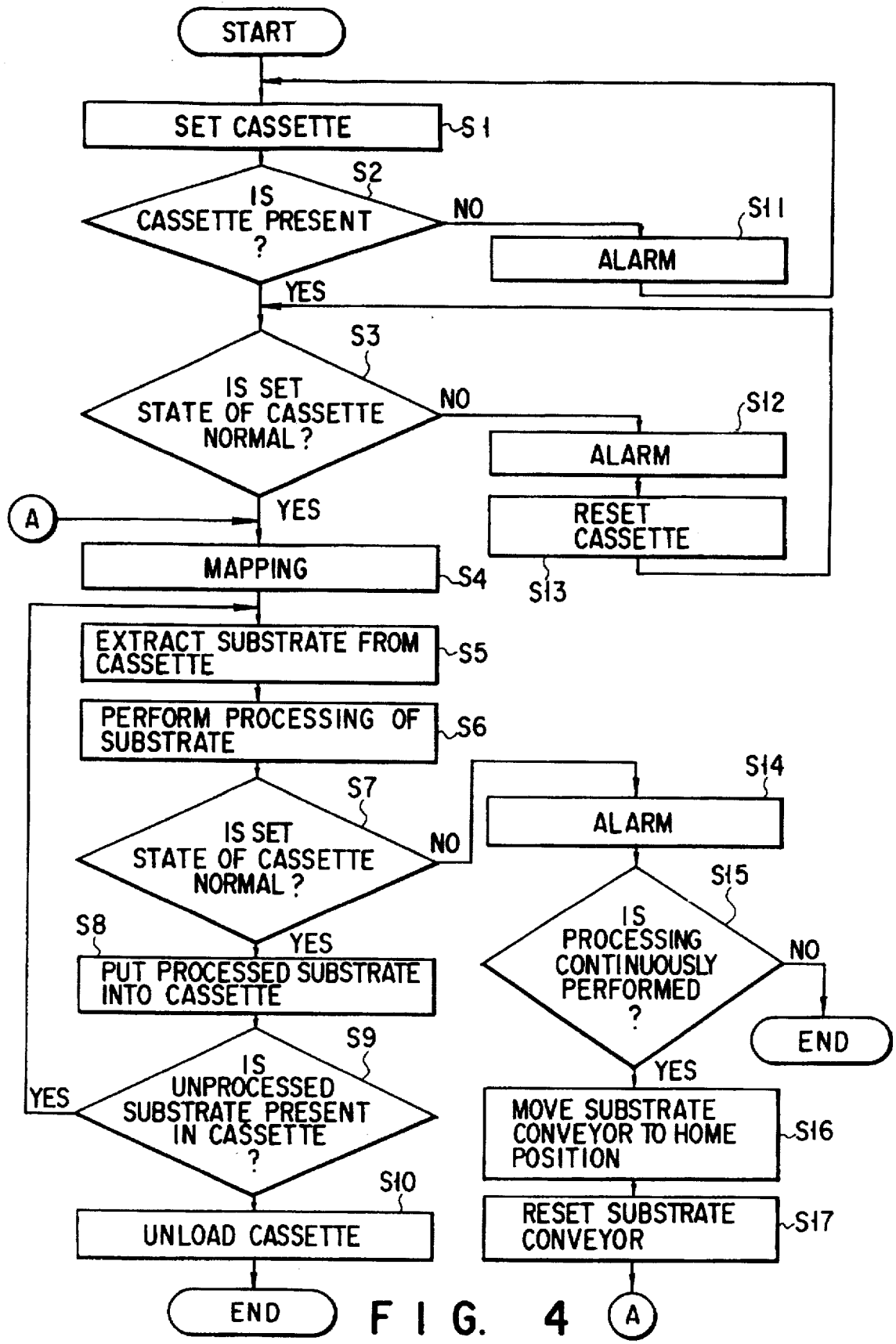
FIG. 4 is a flow chart showing a substrate processing method according to the embodiment of the present invention.

A case wherein the semiconductor wafer W is resist-processed using the processing system 1 described above will be described below with reference to the flow chart shown in FIG. 4.

An initial conditions of cassettes and substrates are filed in advance in the database of a host computer before processing is started. The initial conditions of the cassettes and substrates are predetermined information formed on the basis of a series of processing plans formed in consideration of the before step and the after step.

The wafer cassette 6 is loaded in the loading/unloading section 2, and set on a placing table (step S1). Twenty-five unprocessed (before resist process) semiconductor wafers W are stored in the wafer cassette 6. A sensor 60 detects the wafer cassette 6 on the placing table to transmit a detection signal to the CPU 8. The CPU 8 checks first, on the basis of the detection signal and the initial conditions, whether the wafer cassette 6 is present on the placing table (step S2). If NO in step S2, the alarm system 9 is operated (step S11) to notify an operator and the host computer 92 that no wafer cassette 6 is present on the placing table. The operator or the cassette convey device 20 sets the wafer cassette 6 on the placing table (step S1). On the other hand, if YES in step S2, the CPU 8 checks, on the basis of the detection signal, whether the set state of the wafer cassette 6 is normal (step S3). If NO in step S3, the alarm system 9 is operated (step S12) to notify the operator and the host computer 92 that no wafer cassette 6 is placed at a predetermined position. The operator and the cassette convey device 20 resets the wafer cassette 6 at the predetermined position of the placing table (step S13).

When the cassette sensor 7 detects that no cassette 6 is present on the placing table, or when the cassette sensor 7 detects that the wafer cassette 6 is present on the placing table first, but continuously detects that no wafer cassette 6 is present on the placing table after a timer set time has elapsed, the signal from the cassette sensor 7 is transmitted to the CPU 8. The CPU 8 operates the alarm system 9 on the basis of the signal (step S11 and step S12).

If YES in step S3, the position of the wafer W in the wafer cassette 6 is detected by the mapping sensor 18, and the mapping sensor 18 stores the position detection information in the CPU 8 and the host computer 92 as mapping data (step S4). The CPU 8 selects a wafer Wt to be processed from the wafers W in the wafer cassette 6 on the basis of the mapping data and a predetermined recipe stored in advance, and the CPU 8 causes the transfer arm 15 to extract the selected wafer Wt from the wafer cassette 6 (step S5).

The transfer arm 15 gives the selected wafer Wt to the main arm 10. The wafer Wt is sequentially loaded in the processing units 34 to 37a by the main arm 10, and sequentially loaded in the processing units 38 and 39 by the second main arm 10a, and then loaded in the exposure processing section 40. The selected wafer Wt is sequentially processed by the processing units and the device in accordance with procedures which are programmed in advance (step S6). More specifically, the wafer Wt is subjected to a washing process and an adhesion process, cooled, coated with a resist, prebaked, cooled, exposed, developed, post-baked, and cooled.

Upon completion of the series of resist processes, the cassette sensor 7 detects the position of the wafer cassette 6, and the CPU 8 checks, on the basis of the position detection signal, whether the set state of the wafer cassette 6 is normal (step S7). If YES in step S7, the processed wafer Wt in a predetermined portion of the cassette by the transfer arm 15 (step S8). The address information of the processed wafer Wt is transmitted to the CPU 8, thereby updating the mapping data.

At this time, on the basis of the mapping data, the CPU 8 checks whether an unprocessed (before resist process) is present in the wafer cassette 6 (step S9). If YES in step S9, the unprocessed wafer W is extracted from the wafer cassette 6 (step S5), and the wafer is sequentially processed in accordance with a predetermined recipe (step S6). On the other hand, if NO in step S9, the wafer cassette 6 is unloaded from the loading/unloading section 2 (step S10). In this manner, the series of resist processes are completed, and the processed wafers W in each cassette 6 are shifted to the next step at once.

If NO in step S7, the alarm system 9 is operated to notify the operator and the host computer 92 that the set state of the wafer cassette 6 is abnormal (step S14). The operator and the host computer 92 recognize the states of the wafer cassette 6, the wafer W, and the substrate transferring device 4 to determine, on the basis of the states, whether processing is continuously performed (step S15). If NO in step S15, processing for the wafer W is interrupted or stopped until the loading/unloading section 2 is recovered.

If YES in step S15, the substrate transferring device 4 is returned to the home position (step S16), and the substrate transferring device 4 is reset (step S17). When the loading/unloading section 2 is recovered, the substrate transferring device 4 is moved from the home position to a portion in front of the wafer cassette 6, and mapping is performed again by the sensor 18 (step S4). When the mapping data does not change, a wafer W is extracted by the transfer arm 15 from a predetermined portion in the wafer cassette 6 to be conveyed to the processing section 3.

When the position of the wafer W in the wafer cassette 6 is different from that obtained before abnormality occurs, the obtained information is transmitted to the CPU 8 to update the mapping data. When the mapping data is updated, the operator, the host computer 92, and the CPU 8 monitor whether the set state of the wafer cassette 6 or the operation of the substrate transferring device 4 is proper. The re-mapping operation described above is applied to a case wherein the operator or the like consciously lifts the cassette 6 up to remove it from the placing table, and places the cassette 6 on the placing table again.

A wafer Wt to be processed is selected on the basis of the latest mapping data obtained by re-mapping the wafers W in the cassette 6, and the selected wafer Wt is extracted from the cassette 6 (step S5). A series of resist processes are executed to the wafer Wt (step S6). Steps S5 to S9 are repeated until all the wafers W in the cassette 6 are processed.

As described above, when the set state of the cassette 6 in which unprocessed wafers W are stored is automatically monitored, and the operation of the transfer arm 15 is automatically monitored, a conveyance error of the wafers W can be prevented. The wafers W can be sequentially conveyed in an order which is programmed in advance, and can be subjected to predetermined processes.

The second embodiment of the present invention will be described below with reference to FIGS. 5 to 7B. In the second embodiment, the present invention is used in a resist processing system for coating a resist on an LCD substrate to develop the resist.

Figure 5:
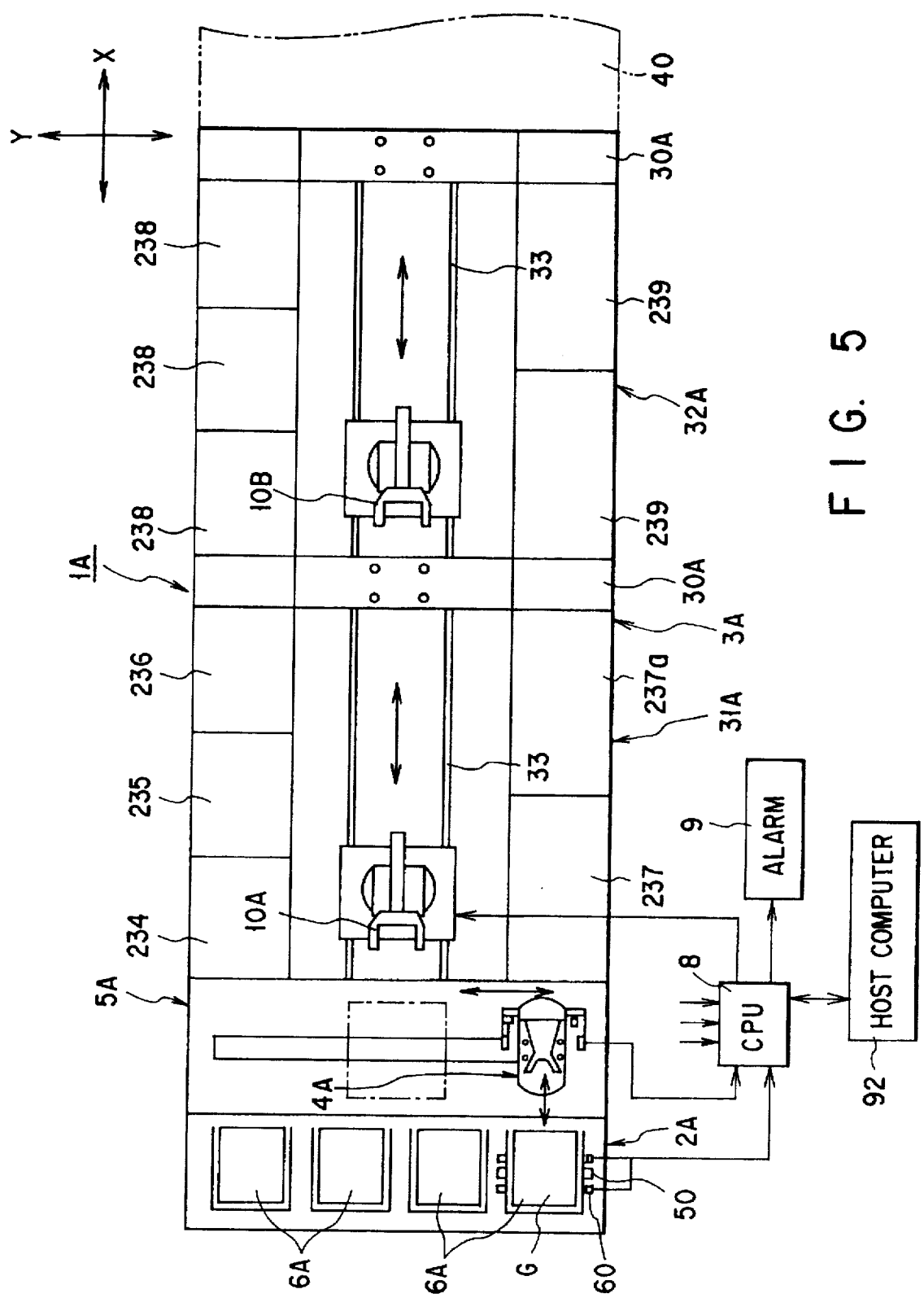
FIG. 5 is a schematic plan view showing a substrate processing apparatus (resist processing system for an LCD substrate) according to an embodiment of the present invention.

As shown in FIG. 5, a resist processing system 1A for an LCD substrate comprises a loading/unloading section 2A, a processing section 3A, a substrate transferring device 4A using a transfer arm scheme, an exchanging section 5A, and two main arms 10A and 10B. The loading/unloading section 2A comprises a placing table 2a, arranged on one end side of the resist processing system 1A, on which a plurality of cassettes 6A are placed.

A cassette convey device (not shown) is arranged on the front side of the loading/unloading section 2A, so that the cassettes 6A are loaded in or unloaded from the loading/unloading section 2A by the cassette convey device. In each cassette 6A, e.g., twenty five LCD substrates G are stored. The cassette 6A is placed on the placing table of the loading/unloading section 2A such that the substrates G are kept horizontal. The exchanging section 5A is arranged between the loading/unloading section 2A and the processing section 3A. The exchanging section 5A comprises the substrate transferring device 4A, and the LCD substrates G are extracted from the cassette 6A by the substrate transferring device 4A one by one.

The processing section 3A comprises a first processing section 31A, a second processing section 32A, and an exposure processing section 40. The first processing section 31A has a plurality of processing units 234 to 237a, a common convey path 33, and the substrate transferring device (main arm) 10A. The processing units 234 to 237a are arranged on both the sides of the common convey path 33, and have loading/unloading ports facing the common convey path 33. The main arm 10A is arranged such that the main arm 10A can travel along the common convey path 33, and the substrate G can be exchanged between the transfer arm 4 and each of the processing units 234 to 237a. The second processing section 32A also has a plurality of processing units 238 and 239, the common convey path 33, and the main arm 10B.

The processing unit 234 comprises a brush washing device for brush-washing the substrate G. A processing unit 235 comprises a jet-water washing device for washing the substrate G with high-pressure jet water. The processing unit 236 comprises an adhesion processing device for performing a hydrophobic process to the surface of the substrate G. The processing unit 237 comprises a resist coating device for coating a resist on the substrate G. The processing unit 237a comprises a resist removing device for removing the coated resist from the substrate G. The processing unit 238 comprises a baking device for heating the substrate G and a cooling device for cooling the substrate G. The processing unit 239 comprises a developing device for developing the coated resist.

An interface section 30A is arranged between the first processing section 31A and the second processing section 32A, and the substrate G is exchange between the first processing section 31A and the second processing section 32A through the interface section 30A. An interface section 30a is also arranged between the second processing section 32A and the exposure processing section 40, and the substrate G is exchanged between the second processing section 32A and the exposure processing section 40 through the interface section 30A.

Figure 6:
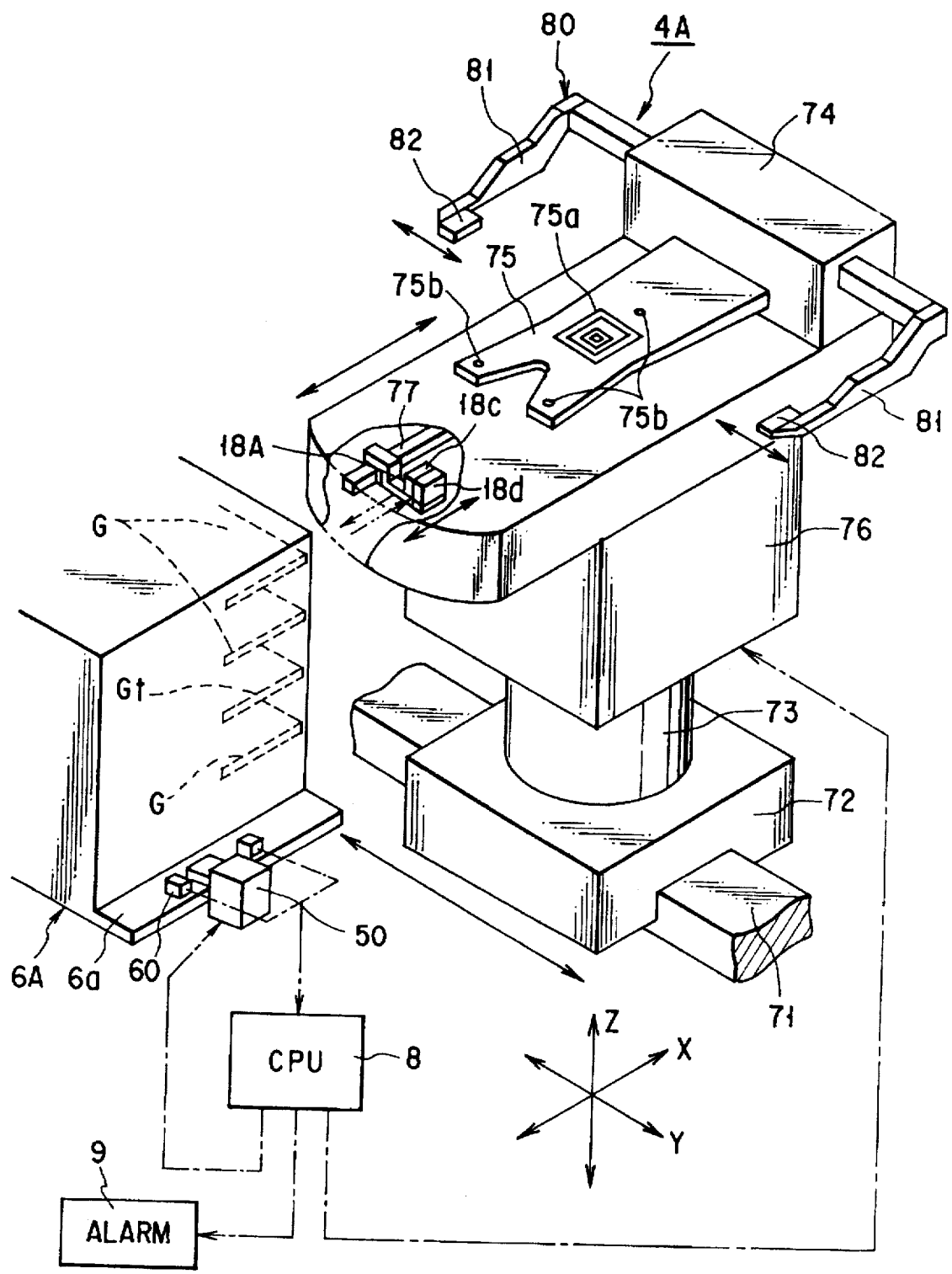
FIG. 6 is a perspective view showing a conveyor (transfer arm) for an LCD substrate.

As shown in FIG. 6, an upper drive section 74 of the substrate transferring device 4A is connected to a lower drive section 72 through a vertical shaft 73 and a mobile section 76. The lower drive section 72 incorporates a Y-axis moving mechanism having a ball-screw mechanism, and the lower drive section 72 can be slidably moved along a rail 71 in the Y-axis direction. The mobile section 76 incorporates a lifting mechanism and a θ-rotation mechanism having a stepping motor or the like, and the mobile section 76 can vertically move the upper drive section 74 in a Z-axis direction, and can rotate the upper drive section 74 by an angle θ about the Z axis. In addition, the mobile section 76 incorporates an X-axis moving mechanism having a stepping motor or the like, and the mobile section 76 can respectively move a transfer arm 75 forward/backward in the X-Y plane.

The transfer arm 75 is constituted by a rectangular plate member having a width set to be inserted in the cassette 6A. A suction groove 75a communicating with a vacuum pump is formed in the upper surface of the transfer arm 75, so that the LCD substrate G is held by vacuum adsorption. Three projections 75b consisting of a nylon resin are formed around the suction groove 75a. When the projections 75b described above are brought into contact with the rear surface of the glass substrate G, the glass substrate G can be prevented from being electrostatically charged.

A mapping sensor 18A is attached to the mobile section 76, and the mapping sensor 18A detects the presence/absence, position, and number of substrates G stored in the cassette 6A. The mapping sensor 18A is arranged movable along a guide bar 77 such that the mapping sensor 18A can be closed to or moved from the cassette 6A. The mapping sensor 18A is a reflection type photosensor having a light-emitting section 18c and a light-receiving section 18d. The light-receiving section 18d receives beam light reflected from the substrate G and converts the beam light into an electric signal to transmit the electric signal to the CPU 8.

Central positioning arms 80 are attached to both the sides of the upper drive section 74 such that the central positioning arms 80 can be opened/closed. The central positioning arms 80 has a function of moving and correcting the substrates G stored in the cassette 6A to the central position of the cassette to position the substrate G. The central positioning arms 80 comprise a pair of arm members 81 and a pair of substrate pressing members 82 consisting of a nylon resin. The substrate pressing member 82 is attached to the leading end of each arm member 81. When one pair of arm members 81 are closed to each other in a Y-axis direction by the upper drive section 74, the substrate pressing members 82 press the side end faces of the substrate G to center the substrate in the cassette 6A.

A sensor 60 is arranged at a proper position of the loading/unloading section 2A to detect whether the cassette 6A is properly fixed and held by a locking mechanism 50. As the sensor 60, for example, a photosensor having a light-emitting element and a light-receiving element, a capacitance type sensor, a microswitch or the like can be employed. The sensor 60 is connected to the input terminal of the CPU 8. When the CPU 8 receives a cassette detection signal, the CPU 8 executes calculation with communicating with a host computer 92, and transmits command signals to the locking mechanism 50, the substrate transferring device 4A, an alarm system 9, the main arms 10A and 10B, and the processing units 234 to 239, respectively.

Figure 7A:
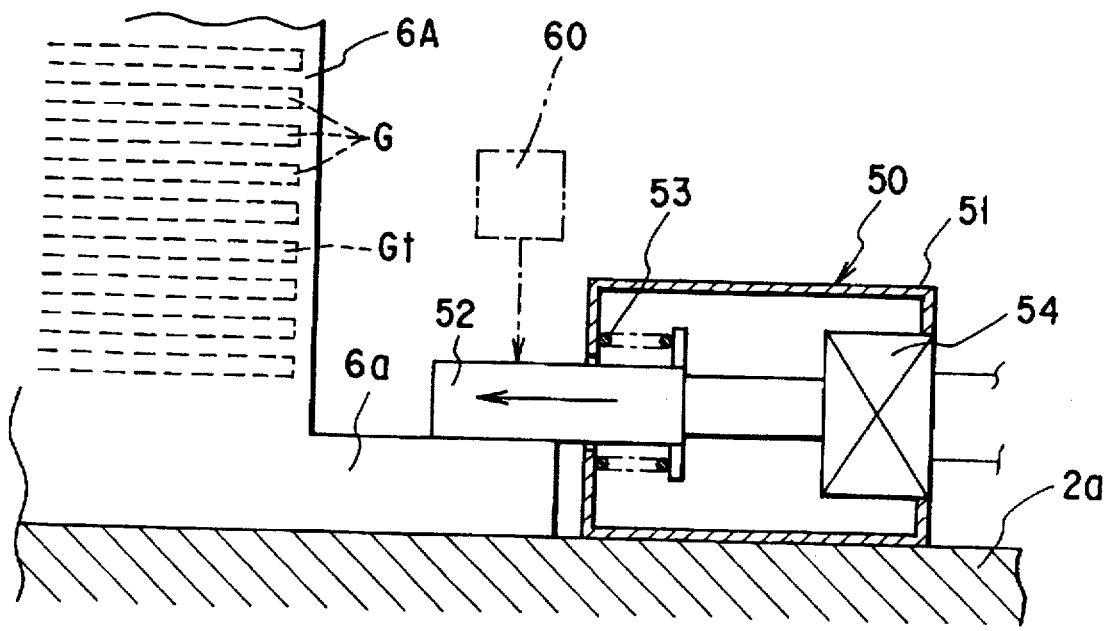
FIGS. 7A and 7B are schematic side views for explaining an operation of a locking mechanism for connecting and fixing a cassette to a placing table.
Figure 7B:
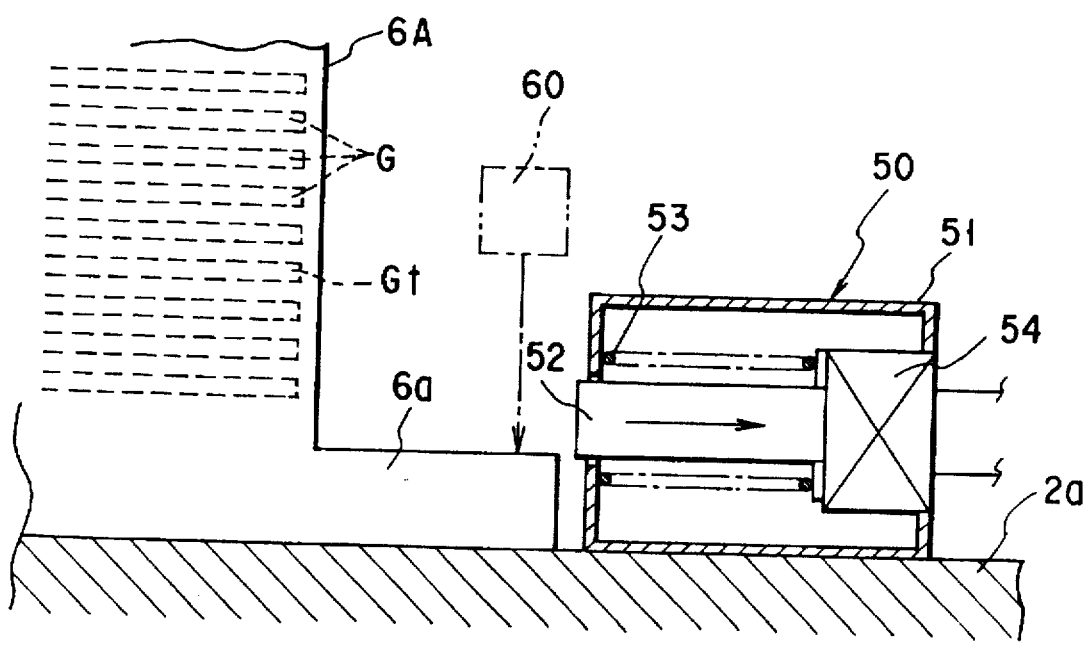

As shown in FIG. 7B, the locking mechanism 50 is arranged on the placing table 2a of the loading/unloading section 2A, a lock piece 52 is extended from a case 51 or moved into the case 51 by drive sections 53 and 54. The drive sections of the locking mechanism 50 comprise a pressing spring 53 and a solenoid 54.

When the solenoid 54 is rendered conductive, the lock piece 52 extends from the case 51 against the elastic force of the pressing spring 53. As a result, as shown in FIG. 7A, a flange section 6a of the cassette 6A is pressed on the placing table 2a by the lock piece 52, and the cassette 6A is fixed to the placing table 2a to be positioned with respect to the substrate transferring device 4A.

When the sensor 60 detects that no cassette 6A is held and fixed at a predetermined position of the loading/unloading section 2, the alarm system 9 operates to notify the operator and the host computer 92 that the cassette is abnormally held. When the locking mechanism 50 is automatically driven again on the basis of the detection signal, the cassette 6A is fixed and held at the predetermined position. After the cassette 6A is set and fixed at the predetermined position, the substrate transferring device 4A is driven again to detect (map) the substrate G in the cassette 6A.

When the mapping sensor 18A detects information different from information which is programmed in advance or detects the presence of a substrate G of a different type, the alarm system 9 operates in response to an output signal from the CPU 8 on the basis of the detection signal to notify an operator of the state. The substrate transferring device 4A is driven on the basis of the detection signal to move the substrate transferring device 75 from the cassette 6A and to temporarily return the substrate transferring device 75 to an initial position. After the cassette 6A is set and fixed at the predetermined position, the substrate transferring device 4A is driven again to detect (map) the substrate G in the cassette 6A.

A case wherein the LCD substrate G is resist-processed using the processing system 1A described above will be described below with reference to the flow chart shown in FIG. 4.

The cassette 6A is loaded in the loading/unloading section 2A, and set on a placing table (step S1). Twenty-five unprocessed (before resist process) LCD substrates G are stored in the cassette 6A. A sensor 60 detects the cassette 6A on the placing table to transmit a detection signal to the CPU 8. The CPU 8 checks first, on the basis of the detection signal and the initial conditions, whether the cassette 6A is present on the placing table (step S2). If NO in step S2, the alarm system 9 is operated (step S11) to notify an operator and the host computer 92 that no cassette 6A is present on the placing table. The operator or the cassette convey device sets the cassette 6A on the placing table (step S1).

On the other hand, if YES in step S2, the CPU 8 checks, on the basis of the detection signal, whether the set state of the cassette 6A is normal (step S3). If NO in step S3, the alarm system 9 is operated (step S12) to notify the operator and the host computer 92 that no cassette 6A is placed at a predetermined position. The operator and the cassette convey device reset the cassette 6A at the predetermined position of the placing table (step S13). In this case, the locking mechanism 50 may be operated on the basis of a command signal from the host computer 92 such that the cassette 6A is fixed and held at the predetermined position on the placing table by the locking mechanism 50, or the operator may manually place the cassette 6A at the predetermined position.

As shown in FIG. 7A, when the solenoid 54 is rendered conductive, the lock piece 52 extends above the flange section 6a of the cassette 6A against the elastic force of the pressing spring 53, and the flange section 6a is pressed on the placing table 2a by the lock piece 52. In this manner, the cassette 6A is fixed and held on the placing table 2a. On the other hand, as shown in FIG. 7B, when the solenoid 54 is powered off, the lock piece 52 moves into the case 51 by the elastic force of the pressing spring 53 to release the holding state of the cassette 6A. The CPU 8 checks, on the basis of the detection signal from the sensor 60, whether the locking mechanism 50 normally operates.

If YES in step S3, the position of the substrate G in the cassette 6A is detected by the mapping sensor 18A, and the mapping sensor 18 stores the position detection information in the CPU 8 and the host computer 92 as mapping data (step S4). The CPU 8 selects a substrate Gt to be processed from the substrates G in the cassette 6A on the basis of the mapping data and a predetermined recipe stored in advance, and the CPU 8 causes the transfer arm 4A to extract the selected substrate Gt from the cassette 6A (step S5).

The transfer arm 4A gives the selected substrate Gt to the main arm 10A. The substrate Gt is sequentially loaded in the processing units 234 to 237a by the main arm 10A, and sequentially loaded in the processing units 238 and 239 by the second main arm 10B, and then loaded in the exposure processing section 40. The selected substrate Gt is sequentially processed by the processing units and the device in accordance with procedures which are programmed in advance (step S6). More specifically, the substrate Gt is subjected to a washing process and an adhesion process, cooled, coated with a resist, prebaked, exposed, developed, and post-baked.

Upon completion of the series of resist processes, the sensor 60 detects the position of the cassette 6A, and the CPU 8 checks, on the basis of the position detection signal, whether the set state of the cassette 6A is normal (step S7). If YES in step S7, the processed substrate Gt in a predetermined slot of the cassette 6A by the transfer arm 4A (step S8). The address information of the processed substrate Gt is transmitted to the CPU 8, thereby updating the mapping data.

At this time, on the basis of the mapping data, the CPU 8 checks whether an unprocessed (before resist process) is present in the cassette 6A (step S9). If YES in step S9, the unprocessed substrate G is extracted from the cassette 6A (step S5), and the substrate is sequentially processed in accordance with a predetermined recipe (step S6). On the other hand, if NO in step S9, the cassette 6A is unloaded from the loading/unloading section 2A (step S10). In this manner, the series of resist processes are completed, and the processed substrates G in each cassette 6A are shifted to the next step at once.

If NO in step S7, the alarm system 9 is operated to notify the operator and the host computer 92 that the set state of the cassette 6A is abnormal (step S14). The operator and the host computer 92 recognize the states of the cassette 6A, the substrate G, and the substrate transferring device 4A to determine, on the basis of the states, whether processing is continuously performed (step S15). If NO in step S15, processing for the substrate G is interrupted or stopped until the loading/unloading section 2A is recovered.

If YES in step S15, the substrate transferring device 4A is returned to the home position (step S16), and the substrate transferring device 4A is reset (step S17). When the loading/unloading section 2A is recovered, the substrate transferring device 4A is moved from the home position to a portion in front of the cassette 6A, and mapping is performed again by the sensor 18 (step S4). The obtained information is transmitted to the CPU 8 to update the mapping data. A substrate Gt to be processed is selected on the basis of the latest mapping data obtained by re-mapping the substrates G as described above, and the selected substrate Gt is extracted from the cassette 6 (step S5). A series of resist processes are executed to the substrate Gt (step S6). Steps S5 to S9 are repeated until all the substrates G in the cassette 6 are processed.

According to the above method, a conveyance error of the substrate G can be prevented, and damage to the substrate G can be effectively prevented. For this reason, processing efficiency and a production yield can be improved.

Figure 8:
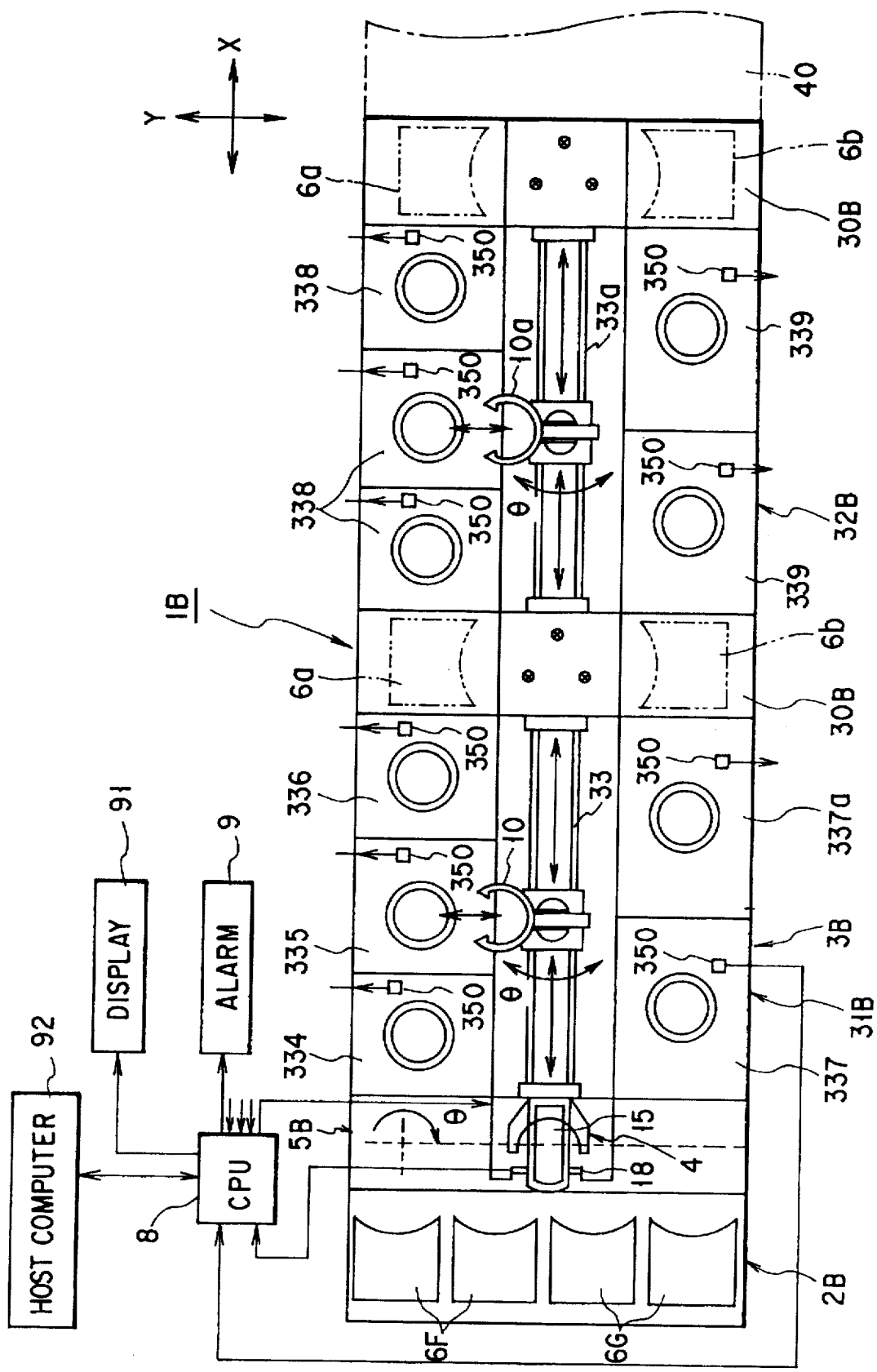
FIG. 8 is a schematic plan view showing a substrate processing apparatus (resist processing system for a semiconductor wafer) according to another embodiment of the present invention.
Figure 9:
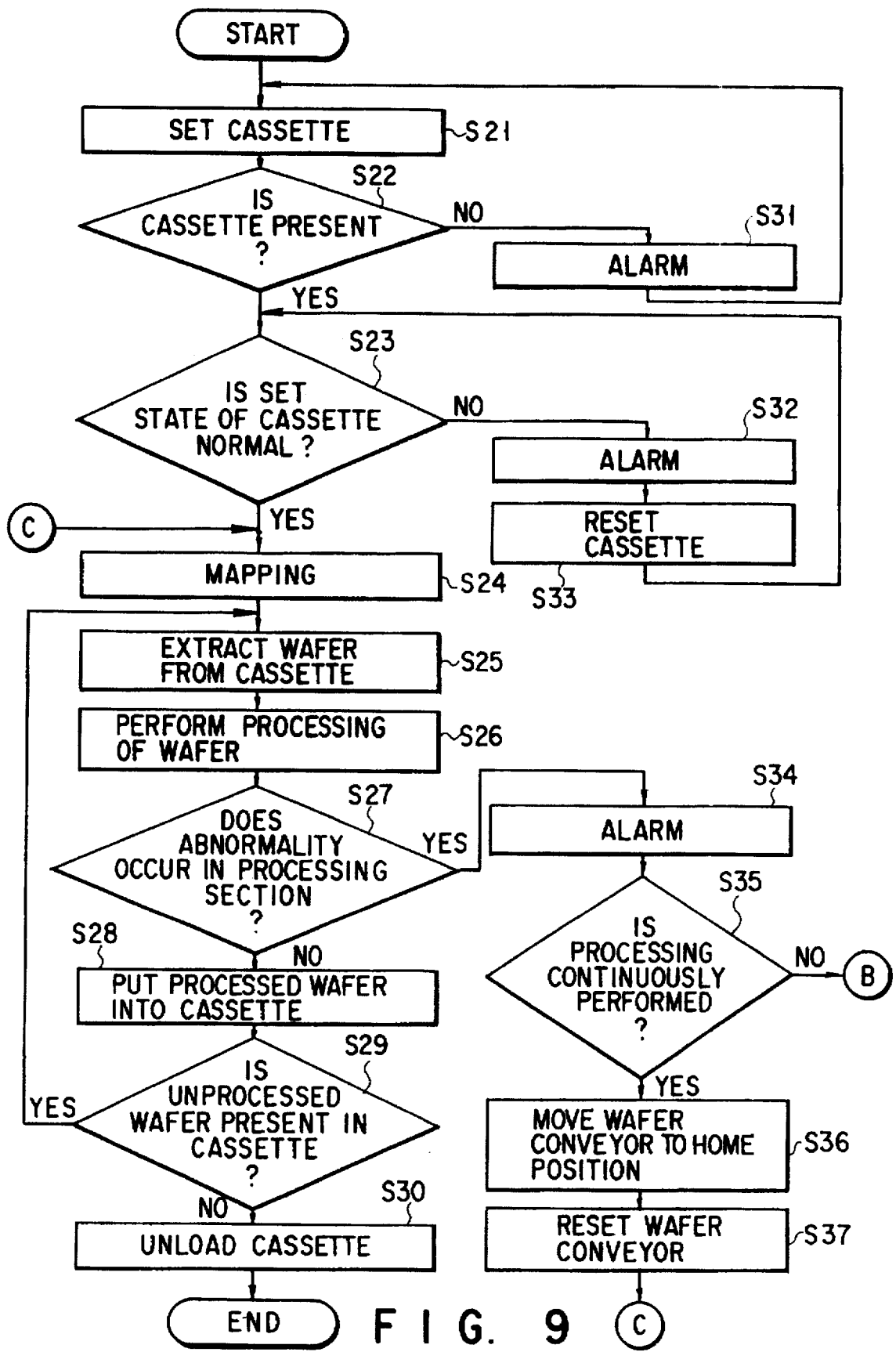
FIG. 9 is a flow chart showing a substrate processing method according to the embodiment of the present invention.
Figure 10:
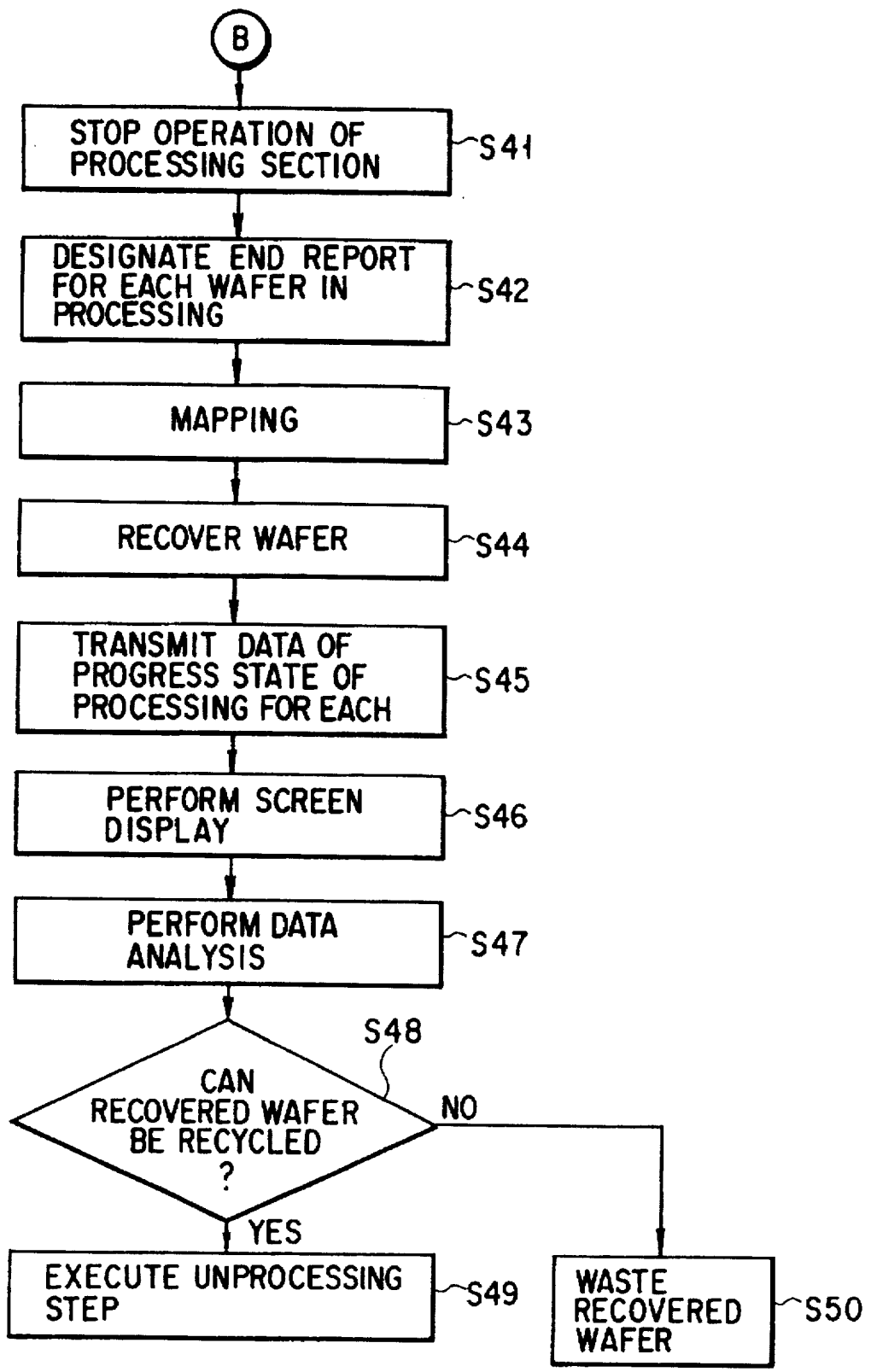
FIG. 10 is a flow chart subsequent to the flow chart shown in FIG. 9.

Another embodiment of the present invention will be described below with reference to FIGS. 8 to 10. Common parts between an apparatus 1B of this embodiment and the apparatus 1 of the first embodiment will be omitted.

In the resist processing system 1B for a semiconductor wafer, two supply cassettes 6F and two recovery cassettes 6G are mounted on a loading/unloading section 2B. Unprocessed (before resist process) wafers W are stored in each supply cassette 6F, and processed (after resist process) wafers W are stored in each recovery cassette 6G.

A monitor display 91 is connected to the CPU 8. An operator can recognize the state of a wafer W in the apparatus 1B by washing the display screen of the monitor display 91.

A sensor 50 is arranged for each processing unit. The locking mechanism 50 detects the identification number of each wafer W or the type of each device. Each sensor 50 transmits a detection signal to the CPU 8.

A case wherein, when a trouble occurs in the resist processing system to interrupt processing, a wafer (incomplete) wafer is recycled will be described below with reference to the flow charts in FIGS. 9 and 10.

The cassettes 6F and 6G are unloaded in the loading/unloading section 2B, and set on a placing table 2a (step S21). Twenty-five unprocessed (before resist process) semiconductor wafers W are stored in the cassette 6F. The cassette 6G is empty before processing is started.

The cassettes 6F and 6G on the placing table 2a are detected, and the detection signal is transmitted to the CPU 8. The CPU 8 checks, on the basis of the detection signal, whether the cassettes 6F and 6G are present on the placing table 2a (step S22). If NO in step S22, an alarm system 9 is operated (step S31) to notify the operator and a host computer 92 that no cassettes 6F and 6G are present on the placing table 2a. The operator and a cassette convey device 20 set the cassettes 6F and 6G on the placing table 2a (step S21).

On the other hand, if YES in step S22, the CPU 8 checks, on the basis of the detection signal, whether the set states of the cassettes 6F and 6G is normal (step S23). If NO in step S23, the alarm system 9 is operated (step S32) to notify the operator and the host computer 92 that no cassettes 6F and 6G are placed at predetermined positions. The operator or the cassette convey device resets the cassettes 6F and 6G at the predetermined position of the placing table (step S33).

When it is detected that no cassettes 6F and 6G are present on the placing table 2a, or when it is detected that the cassettes 6F and 6G are present on the placing table first, but it is continuously detected that no cassettes 6F and 6G are present on the placing table after a timer set time has elapsed, the signal is transmitted to the CPU 8. The CPU 8 operates the alarm system 9 on the basis of the signal (step S31 and step S32).

If YES in step S23, the position of the wafer W in the cassette 6F is detected by the mapping sensor 18, and the mapping sensor 18 stores the position detection information in the CPU 8 and the host computer 92 as mapping data (step S24). The CPU 8 selects a wafer Wt to be processed from the wafers W in the cassette 6F on the basis of the mapping data and a predetermined recipe stored in advance, and the CPU 8 causes the transfer arm 15 to extract the selected wafer Wt from the cassette 6F (step S25).

The transfer arm 15 gives the selected wafer Wt to a first main arm 10. The wafer Wt is sequentially loaded in the processing units 334 to 337a by the first main arm 10, and sequentially loaded in the processing units 338 and 339 by a second main arm 10a, and then loaded in an exposure processing section 40. The selected wafer Wt is sequentially processed by the processing units and the device in accordance with procedures which are programmed in advance (step S26). More specifically, the wafer Wt is subjected to a washing process and an adhesion process, cooled, coated with a resist, prebaked, cooled, exposed, developed, postbaked, and cooled.

The CPU8 checks whether abnormality occurs in a processing section 3B and the loading/unloading section 2B (step S27). If NO in step S27, the position of the recovery cassette 6G is detected, and the CPU 8 transmits a command signal to the substrate transferring device 4 on the basis of the position detection signal and causes the transfer arm 15 to store the processed wafer Wt in a predetermined portion of the recovery cassette 6G (step S28).

The CPU 8 checks, on the basis of the mapping data, whether an unprocessed (before resist process) wafer W is present in the wafer W (step S29). If YES in step S29, the unprocessed wafer W is extracted from the cassette 6F (step S25), and the wafer W is sequentially processed in accordance with a predetermined recipe (step S26). In step S26, the CPU 8 time-controls (sequentially controls) a series of processing flows in accordance with a predetermined recipe (time table). An object to be time-controlled is a movement time of the substrate from a certain process to the next process or a processing time required for processing itself.

On the other hand, if NO in step S29, the cassette 6F is unloaded from the loading/unloading section 2B (step S30). In this manner, the series of resist processes are completed, and the processed wafers in each cassette 6A are shifted to the next step at once.

If YES in step S27, the alarm system 9 is operated to notify the operator and the host computer 92 that abnormality occurs in the processing section 3B, the exposure processing section 40, and the loading/unloading section 2B (step S34). For example, when a substrate which is out of the time table is detected, or an excessive current flows in the drive system of the conveyor, the CPU 8 determines that abnormality occurs in the processing section 3 (step S27).

The operator and the host computer 92 recognize the states of the processing section 3B, the exposure processing section 40, and the loading/unloading section 2B to determine, on the basis of the states, whether processing is continuously performed (step S15). If YES in step S35, the substrate transferring device 4 is returned to a home position (step S36), and the substrate transferring device 4 is reset (step S35). When the loading/unloading section 2A is recovered, the substrate transferring device 4 is moved from the home position to a portion in front of the cassettes 6F and 6G, and mapping is performed again by the sensor 18 (step S24). When the mapping data does not change, a wafer W is extracted by the transfer arm 15 from a predetermined portion in the cassette 6F to be conveyed to the processing section 3.

If NO in step S35, the operations of the processing section 3B, the exposure processing section 40, and the loading/unloading section 2 (step S41). The presence/absence and the type of a wafer W in processing are detected by the sensor 50, and the detection signals are transmitted to the CPU 8. The CPU 8 communicates with the host computer 92 to designate the cassettes 6F and 6G serving as end ports for each wafer W in processing (step S42). The wafers W in the cassettes 6F and 6G are mapped (step S43), and incomplete wafers W are recovered by the designated cassettes 6F and 6G (step S44). In step S44, a completely unprocessed wafer W is directly returned to the supply cassette 6F. An incompletely wafer W in processing is recovered by the supply cassette 6F. The processed wafer W is recovered by the recovery cassette 6G.

The CPU 8 transmits the progress state of processing for each incomplete wafer W to the host computer 92 (step S45). The CPU 8 displays a state in the apparatus 1B on the monitor display 91 (step S46). For example, unprocessed states, i.e., the first wafer W in coating is stopped, the second wafer W in conveyance by the main arm 10 is stopped, the third wafer W in brush-washing is stopped, the fourth wafer W in conveyance to the processing section 3 is stopped, and the like are displayed on the screen of the monitor display 91 with letters, predetermined numbers, or the like.

The operator analyses data sent from the host computer 92 with watching the display screen of the display 91 (step S47). The operator determines, on the basis of the data analysis, whether each recovered incomplete wafer W can be recycled (step S48).

If NO in step S48, the incomplete wafer W is wasted (step S50). On the other hand, if YES in step S48, an unprocessing step is executed to the incomplete wafer W (step S49). For example, in a recovered wafer whose resist coating is interrupted, the coated resist is removed from the wafer W, and the wafer W is washed and dried. A resist is coated on the wafer W again. The coated resist is exposed and developed.

According to the above apparatus and method, the processing state of each wafer W is displayed on the screen of the display 91 in real time. For this reason, an operator or the like can properly recognize the processing state of a wafer W in processing when the operation of each processing device is stopped.

Figure 11:
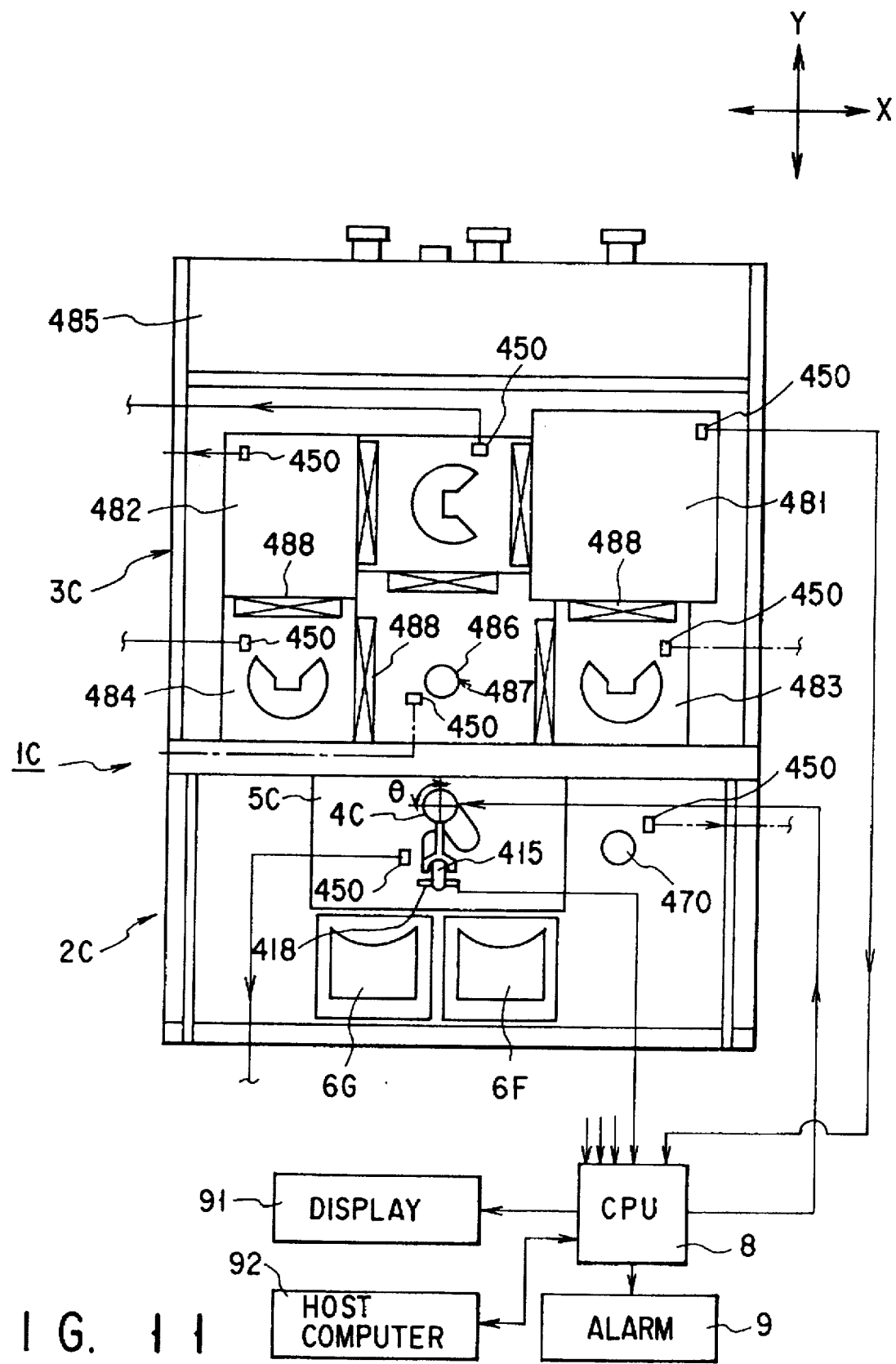
FIG. 11 is a schematic plan view showing a substrate processing apparatus (etching process system for a semiconductor wafer) according to still another embodiment of the present invention.

Another embodiment of the present invention will be described below with reference to FIG. 11. In this embodiment, a case wherein the present invention is applied to an etching process system for etching a semiconductor wafer will be described below. The common parts between this embodiment and the above embodiment will be omitted.

An etching process system 1C comprises a loading/unloading section 2C, a processing section 3C, a substrate transferring device 4C, and an exchanging section 5C. Mapping sensors (not shown) for detecting the state of a wafer W in cassettes 6F and 6G are attached to both the sides of the substrate transferring device 4C.

The exchanging section 5C comprises an alignment section 470 for aligning a wafer W conveyed from the loading/unloading section 2C.

The processing section 3C comprises a first etching device 481 for performing main etching to the wafer W in a vacuum state, and a second etching device 482 for performing an ashing process and a light-etching process serving as processes after etching. The first etching device 481 and the second etching device 482 are connected to the first and second load lock chambers 483 and 484, respectively. A third load lock chamber 485 is connected between the first etching device 481 and the second etching device 482.

An exchanging stage 487 is arranged such that the exchanging stage 487 is surrounded by the first to third load lock chambers 483, 484, and 485. The exchanging stage 487 comprises a placing table 486, which can vertically move, for temporarily placing a wafer W. Gate valves 488 are arranged on the atmospheric air side and etching device side of these load lock chambers 483 to 485, respectively.

Sensors 450 for detecting the processing states of wafers W are arranged in the first and second etching devices 481 and 482, in the first to third load lock chambers 483 to 485, and near the exchanging stage 487. These sensors 450 are connected to a CPU 8.

The operation manner of the etching process system arranged as described above will be described below.

A predetermined wafer W is extracted from the supply cassette 6F by a transfer arm 415 of the substrate transferring device 4C, and alignment (alignment for an orientation flat) is performed by the alignment section 470. The wafer is given to the exchanging stage 487.

The first load lock chamber 483 and the first etching device 481 are set to have almost the same degree of vacuum, e.g., $1 \times 10^{-3}$ Torr or less in advance, the gate valve 488 of the first load lock chamber 483 is opened to load the wafer W from the first load lock chamber 483 into the first etching device 481. Therefore, the gate valve 488 between the first load lock chamber 483 and the first etching device 481 is closed.

A ($CF_4+CHF_3+Ar$) gas is supplied into the first etching device 481 as an etching gas, and the device is evacuated to have a degree of vacuum of 300 mTorr. When a high-frequency power of 1,300 W is applied across electrodes (not shown), a gas plasma is generated in the device, thereby etching the thin film layer of the wafer W.

After etching process, the wafer W is loaded in the second etching device 482 through the third load lock chamber 485, and the wafer W is subjected to an ashing process and a light-etching process. In this case, the second etching device 482 is set to have a degree of vacuum of about 1 Torr, and a temperature in the second etching device 482 is set to be about 250° C. An $O^2$ gas serving as an ashing process gas is supplied into the second etching device 482 at a flow rate of about 3,000 Sccm, and a high-frequency power of 700 W is applied across the electrodes to convert the gas into a plasma, thereby performing an ashing process to the wafer W.

Upon completion of ashing process, the wafer W is loaded in the second load lock chamber 484, received by the substrate transferring device 4C through the exchanging stage 487, and then loaded in the recovery cassette 6G, thereby completing a series of processes.

When the etching process system 1C is suddenly stopped because of any trouble, the alarm system 9 operates to notify the operator that the etching process system 1C is stopped. When the operator resets the system 1C and then turns on a switch, the processing states of wafers W in processing are detected by the sensors 50 arranged at respective positions, and the processing states are displayed on the screen of the display 91. The mapping sensor 18A of the substrate transferring device 4C detects the states of the wafers W in the cassette 6F and the states of the wafers W in the cassette 6G. In this manner, for example, unprocessed states, i.e., the first wafer W is stopped in the second etching device 482, the second wafer W is stopped in the third load lock chamber 485, the third wafer W is stopped in the first etching device 481, the fourth wafer W in conveyance to the processing section 3C is stopped, and the like are displayed on the screen of the display 91 with letters, predetermined numbers, or the like. An unprocessed wafer W is returned to the cassette 6F, and a wafer W in processing and a processed wafer W are stored in the recovery cassette 6G. In this manner, after the unprocessed wafer W and the wafer W in processing (respective processes such as a resist coating process are completed) are recovered, the operator removes an incomplete processed wafer W (respective processes such as a resist coating process are not completed) and operates the etching process system 1C. Therefore, subsequent processes can be continuously performed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate processing method in which substrates are extracted from a plurality of cassettes of a loading/unloading section, the extracted substrates are loaded in a processing section and sequentially processed, the processed substrates are stored in the cassettes of said loading/unloading section, characterized by comprising the steps of:

(a) the step of predetermining initial conditions for cassettes and substrates before processing is started;
   (b) the step of setting the cassettes in which the substrates are stored, in said loading/unloading section on the basis of the initial conditions;

(c) the step of detecting the states of the cassettes set in said loading/unloading section and checking, on the basis of the detection results, whether the cassettes are set in the states set in the step (a);

(d) the step of displaying the states of the cassettes when it is determined in the step (c) that the state of at least one cassette is not a state set in the step (a);

(e) the step of resetting the cassette in the state set in the step (a) on the basis of the display in the step (d);

(f) the step of detecting the substrates which are present in the cassettes set in said loading/unloading section and obtaining mapping data on the basis of the detection results;

(g) the step of selecting a substrate from the cassettes in said loading/unloading section on the basis of the mapping data and the initial conditions;

(h) the step of extracting the selected substrate from the cassettes, conveying the substrate to a processing section, and processing the substrate according to the initial conditions; and (i) the step of storing the processed substrate in a cassette set in said loading/unloading section.

2. A substrate processing method according to claim 1, wherein the presence/absence of a cassette in said loading/unloading section is detected in step (c);

when it is determined in the step (c) that no cassette is present at a position set by the initial conditions, it is displayed in the step (d) that no cassette is present the position;

in the step (e), a cassette is reset at the position set by the initial setting condition set in the step (a).

3. A substrate processing method according to claim 1, wherein it is determined in the step (c) that an operation for detecting the state of the cassette is erroneous;

in the step (d), it is determined that the detection operation is an erroneous operation, and the operation returns to the step (c) after the operation for detecting the state of the cassette is regulated.

4. A substrate processing method according to claim 1, wherein, in the step (h), when abnormality occurs in an operation of substrate convey means, said substrate convey means is initialized, and the operation returns to the step (f).

5. A substrate processing method according to claim 4, wherein, in the step (f), the types of substrates in the cassette set in said loading/unloading section are detected.

6. A substrate processing method according to claim 1, wherein, in the step (b), the cassette is fixed and held at a set position of said loading/unloading section;

in the step (c), it is checked whether the cassette is properly fixed and held at the set position; and in the step (d), it is displayed that the cassette is not properly fixed and held, and the operation returns to the step (b) after an operation for stably fixing and holding the cassette is regulated.

7. A substrate processing method according to claim 1, wherein, in the step (d), an alarm is issued when the state of at least one cassette is not the initial states set in the step (a).

8. A substrate processing method according to claim 1, wherein, in the step (d), an alarm is issued when an abnormality occurs in at least one of said processing section, said loading/unloading section, and a substrate convey means.

9. A substrate processing method according to claim 1, wherein, in the step (a), initial conditions of the cassettes and substrates are set using the mapping data obtained in the step (f) in previous processing.

10. A substrate processing method in which substrates are extracted from a supply cassette of a loading/unloading section, the extracted substrates are loaded in a processing section and sequentially processed, the processed substrates are stored in a recovery cassette of said loading/unloading section, characterized by comprising:

(A) the step of predetermining initial conditions of the supply cassette, the recovery cassette, and substrates;

(B) the step of setting the supply cassette and the recovery cassette in said loading/unloading section on the basis of the initial conditions;

(C) the step of detecting the substrate which are present in the cassette set in said loading/unloading section and obtaining mapping data on the basis of the detection results;

(D) the step of selecting a substrate from the supply cassette on the basis of the mapping data and the initial conditions;

(E) the step of extracting the selected substrate from the supply cassette, conveying the substrate to a processing section, and processing the substrate according to the initial conditions;

(F) the step of detecting the states of a substrate in processing, a processed substrate, and a substrate in conveyance to display the states when an operation of said processing section is stopped to interrupt processing for the substrates;

(G) the step of determining specific cassettes in which the substrate in processing, the processed substrate, and the substrate in conveyance on the basis of the display in the step (F), the mapping data, and the initial conditions; and (H) the step of storing the substrate in processing, the processed substrate, and the substrate in conveyance in the recovery cassette or the supply cassette according to the determination in the step (G).

11. A substrate processing method according to claim 10, wherein, in the step (E), when an abnormality occurs in an operation of substrate convey means, said substrate convey means is initialized, and the operation returns to the step (C).

12. A substrate processing method according to claim 11, wherein, in the step (C), the types of substrates in the cassette set in said loading/unloading section are detected.

13. A substrate processing method according to claim 10, wherein, in the step (B), the cassette is fixed and held at a set position of said loading/unloading section, it is checked whether the cassette is properly fixed and held at the set position, and, when the cassette is not properly fixed and held, it is displayed that the cassette is not properly fixed and held, and an operation for stably fixing and holding the cassette is regulated.

14. A substrate processing method according to claim 10, wherein, in the step (F), an alarm is issued when an abnormality occurs in at least one of said processing section, said loading/unloading section, and said substrate convey means.

15. A substrate processing apparatus in which substrates are extracted from a supply cassette of a loading/unloading section, the extracted substrates are loaded in a processing section and sequentially processed, the processed substrates are stored in a recovery cassette of said loading/unloading section, comprising:

means for predetermining initial conditions of cassettes and substrates before processing is started;

said loading/unloading section having a placing table on which the supply and recovery cassettes are placed;

a processing section having a plurality of processing units for processing the substrates;

means for setting the supply and recovery cassettes in said loading/unloading section on the basis of the initial conditions;

a substrate transferring device for extracting substrates from the cassettes set in said loading/unloading section and conveying the substrates to said processing section;

a first sensor for detecting the substrates which are present in the cassettes set in said loading/unloading section;

means for forming mapping data of the substrates in the cassettes on the basis of the detection results from said first sensor and storing the mapping data;

control means for calling the mapping data from said data storing means and controlling said substrate transferring device on the basis of the mapping data and the initial conditions;

a second sensor for detecting the states of the supply and recovery cassettes set in said loading/unloading section; and display means for detecting the states of the cassettes detected by said second sensor, characterized in that said control means causes said setting means to reset the supply and recovery cassettes on the placing table according to the initial states when the states of the cassettes detected by said second sensor do not satisfy the initial conditions.

16. A substrate processing apparatus according to claim 15, wherein said second sensor comprises a light-emitting element which emits beam light to the cassettes of said loading/unloading section and a light-receiving element which receives light reflected from the cassettes, to detect whether a cassette is present on the placing table.

17. A substrate processing apparatus according to claim 15, further comprising means for detecting the operations of said first and second sensors and transmitting the detection signals to said control means, wherein, when said control means determines, on the basis of a detection signals from said means, that at least one of said first and second sensors erroneously operates, said display means displays that at least one of said first and second sensors erroneously operates.

18. A substrate processing apparatus according to claim 15, characterized by further comprising detection means, integrated with said substrate detection means, for selecting a substrate, and a detection function for the type of a substrate.

19. A substrate processing apparatus according to claim 15, wherein the cassette has a flange section;

said setting means comprises a lock piece arranged in a case, a solenoid drive section for extending the lock piece from the case, and a spring for moving the lock piece into the case, and when the lock piece is extended from the case, the flange section of the cassette placed on the placing table is pressed on the placing table by the lock piece.

20. A substrate processing apparatus according to claim 15, further comprising:

a third sensor for detecting a substrate in said processing section;

means for determining the state of a substrate whose processing is interrupted on the basis of detection information obtained by said third sensor, the initial conditions, and the mapping data when said processing section is stopped in processing of the substrate, wherein a determination result of the state of the substrate whose processing is interrupted is displayed on said display means, and said control means causing said substrate transferring device to store the substrate whose processing is interrupted in one of the supply cassette and the recovery cassette on the basis of the determination result.

21. A substrate processing apparatus according to claim 15, further comprising an alarm system which issues an alarm when an abnormality occurs in at least one of said processing section, said loading/unloading section, and said substrate transferring device.

* * * * *